(12) United States Patent  (10) Patent No.: US 7,768,372 B2
Gianesello  (45) Date of Patent: Aug. 3, 2010

(54) INDUCTANCE COMPRISING TURNS ON SEVERAL METALLIZATION LEVELS

(75) Inventor: Frederic Gianesello, Saint Pierre D'Albigny (FR)

(73) Assignee: STMicroelectronics, SA, Montrouge (FR)

( * ) Notice: Subject to any disclaimer, the term of this patent is extended or adjusted under 35 U.S.C. 154(b) by 0 days.

(21) Appl. No.: 12/218,670

(22) Filed: Jul. 17, 2008

(65) Prior Publication Data

US 2009/0027152 A1  Jan. 29, 2009

(30) Foreign Application Priority Data

Jul. 18, 2007  (FR) .................................. 07 56572

(51) Int. Cl.
 *H01F 5/00* (2006.01)
 *H01F 27/29* (2006.01)
 *H01F 27/28* (2006.01)
(52) U.S. Cl. ................... 336/200; 336/192; 336/223; 336/232
(58) Field of Classification Search .................. None
See application file for complete search history.

(56) References Cited

U.S. PATENT DOCUMENTS

| 6,380,835 | B1 * | 4/2002 | Lee | 336/200 |
| 6,870,457 | B2 * | 3/2005 | Chen et al. | 336/200 |
| 2004/0075521 | A1 * | 4/2004 | Yu et al. | 336/200 |
| 2007/0188288 | A1 * | 8/2007 | Ishii | 336/200 |

* cited by examiner

*Primary Examiner*—Elvin G Enad
*Assistant Examiner*—Mangtin Lian
(74) *Attorney, Agent, or Firm*—The Noblitt Group, PLLC

(57) ABSTRACT

An inductance formed in a stacking of insulating layers, the inductance comprising first and second half-turns, each first half-turn being at least partly symmetrical to one of the second half-turns, the first half-turns being distributed in first groups of first half-turns at least partly aligned along the insulating layer stacking direction and the second half-turns being distributed in second groups of second half-turns at least partly aligned along the insulating layer stacking direction. For any pair of first adjacent half-turns of a same group, one of the first half-turns in the pair is electrically series-connected to the other one of the first half-turns in the pair by a single second half turn and for each pair of second adjacent half-turns of a same group, one of the second half-turns in the pair is electrically series-connected to the other one of the second half-turns in the pair by a single first half-turn.

1 Claim, 5 Drawing Sheets

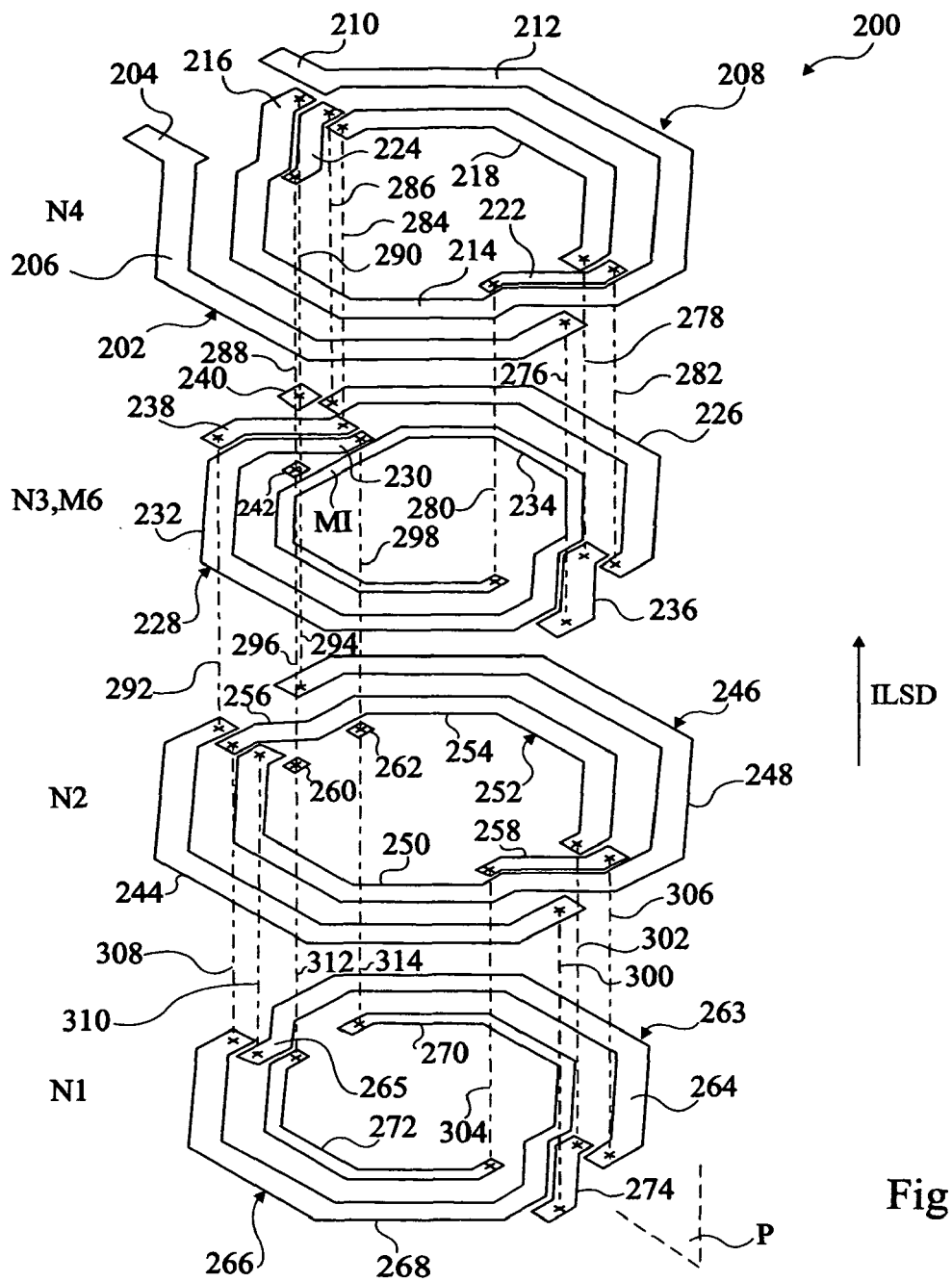
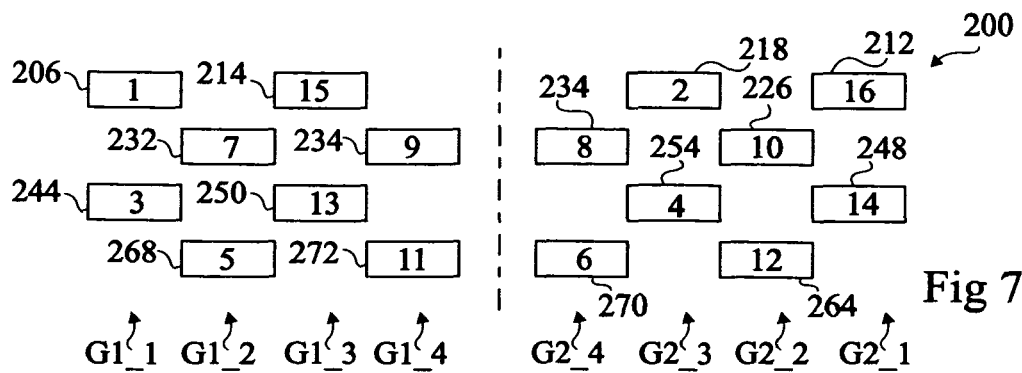
Fig 6
Fig 7

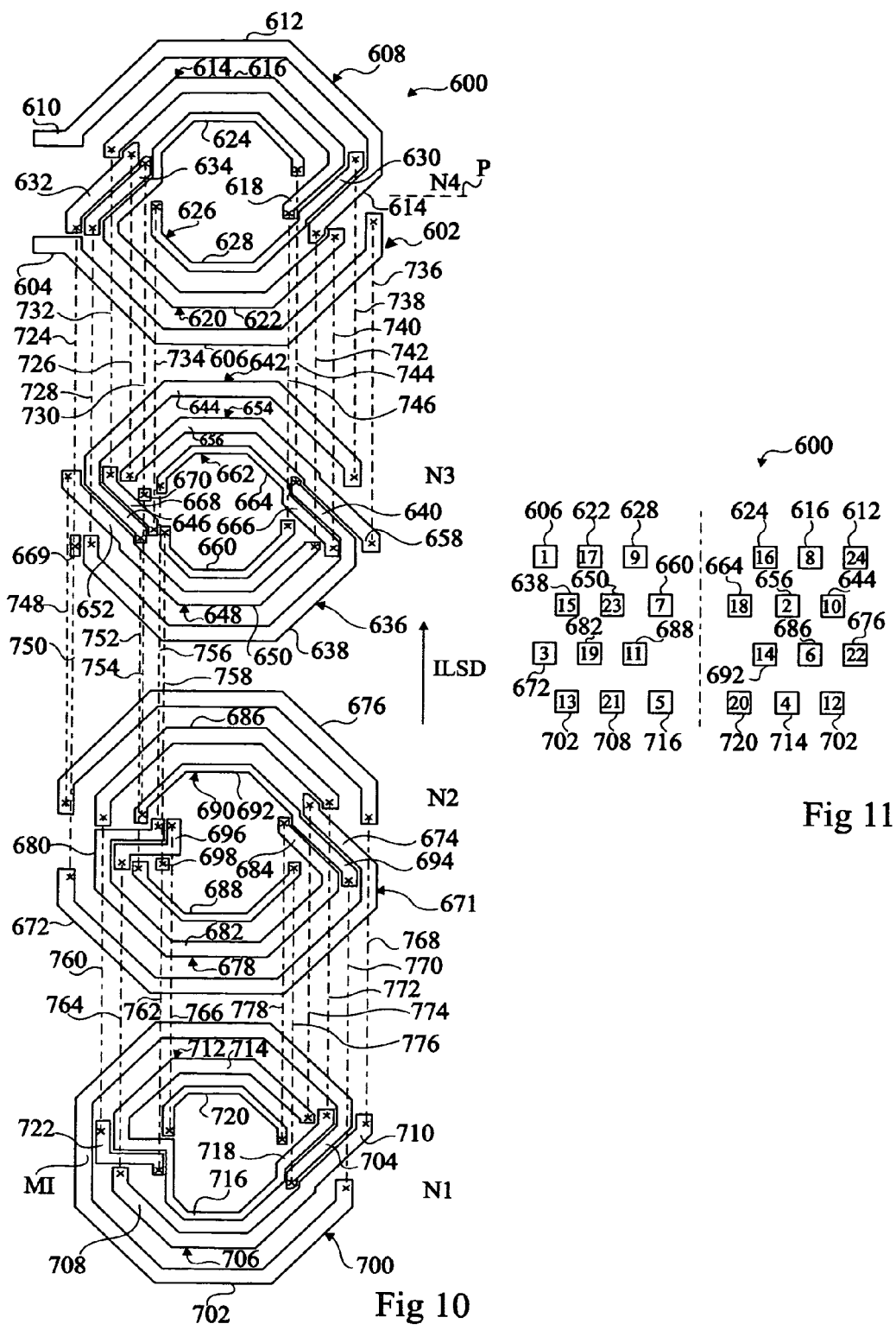

INDUCTANCE COMPRISING TURNS ON SEVERAL METALLIZATION LEVELS

BACKGROUND OF THE INVENTION

1. Field of the Invention

The present invention relates to inductances made in monolithic form and comprising turns formed by metal tracks of several metallization levels.

2. Discussion of the Related Art

To obtain an inductive component having the highest possible inductance while exhibiting a reduced bulk, a possibility is to stack up the inductance turns which then comprise metal tracks of different metallization levels. However, as compared with an inductance having its turns formed by one or several metal tracks of a single metallization level, significant parasitic capacitive couplings between adjacent metal tracks of different metallization levels can be observed for an inductance having its turns formed by metal tracks of several different metallization levels.

Indeed, to decrease as much as possible the inductance bulk, it may be impossible to avoid for two turns formed by successive metallization level tracks, or possibly separated by an intermediary metallization level, to be substantially aligned with respect to one another. For conventional CMOS integrated circuit manufacturing processes, the metal tracks generally have thicknesses on the order of from a few tenths of a micrometer to one micrometer for a width of a few micrometers. As compared with adjacent metal tracks of the same metallization level, the opposite surfaces of aligned metal tracks of different metallization levels are larger. Further, the insulating material thickness separating two aligned metal tracks of successive metallization levels is on the order of a few tenths of a micrometer. For two aligned metal tracks of two distinct metallization levels separated by a single intermediary metallization level, the insulating material thickness separating the two tracks can reach 1 or 2 micrometers. The parasitic capacitive couplings between aligned tracks of different metallization levels can thus be greater than the parasitic capacitive couplings between adjacent tracks of the same metallization level and cause a strong degradation of the inductance performances.

SUMMARY OF THE INVENTION

The present invention relates to obtaining an inductance comprising turns formed by metal tracks of different metallization levels and which are aligned, at least partially, with respect to one another, the inductance exhibiting decreased parasitic couplings between aligned turns of different metallization levels.

Thus, an embodiment of the present invention provides an inductance formed in a stack of insulating layers, the inductance comprising first and second half-turns, each first half-turn being at least partly symmetrical to one of the second half-turns, the first half-turns being distributed in first groups of first half-turns at least partly aligned along the insulating layer stacking direction and the second half-turns being distributed in second groups of second half-turns at least partly aligned along the insulating layer stacking direction. For any pair of first adjacent half-turns of a same group, one of the first half-turns in the pair is electrically series-connected to the other one of the first half-turns in the pair by a single second half turn and for each pair of second adjacent half-turns of a same group, one of the second half-turns in the pair is electrically series-connected to the other one of the second half-turns in the pair by a single first half-turn.

According to an embodiment, each insulating layer is associated with a metallization level from among several metallization levels, at least one of the first or second half-turns comprising at least two tracks of different metallization levels aligned along the insulating layer stacking direction and connected to each other along their entire length.

According to another embodiment, the first and second half-turns comprise metal tracks of at least two metallization levels, the inductance comprising, for each of the two metallization levels, at least two first half-turns and at least two second half-turns.

According to still another embodiment, the first and second half-turns comprise metal tracks of at least four metallization levels, the inductance comprising, for each of the four metallization levels, at least two first half-turns and at least two second half-turns.

The foregoing and other aspects and features of the present invention will be discussed in detail in the following non-limiting description of specific embodiments in connection with the accompanying drawings.

BRIEF DESCRIPTION OF THE DRAWINGS

FIGS. 4, 6, 8, and 10 are simplified perspective view drawings similar to FIG. 1.

FIGS. 5, 7, 9, and 11 are simplified cross-section drawings similar to FIG. 2 for other embodiments of inductances.

DETAILED DESCRIPTION

Figure 1:
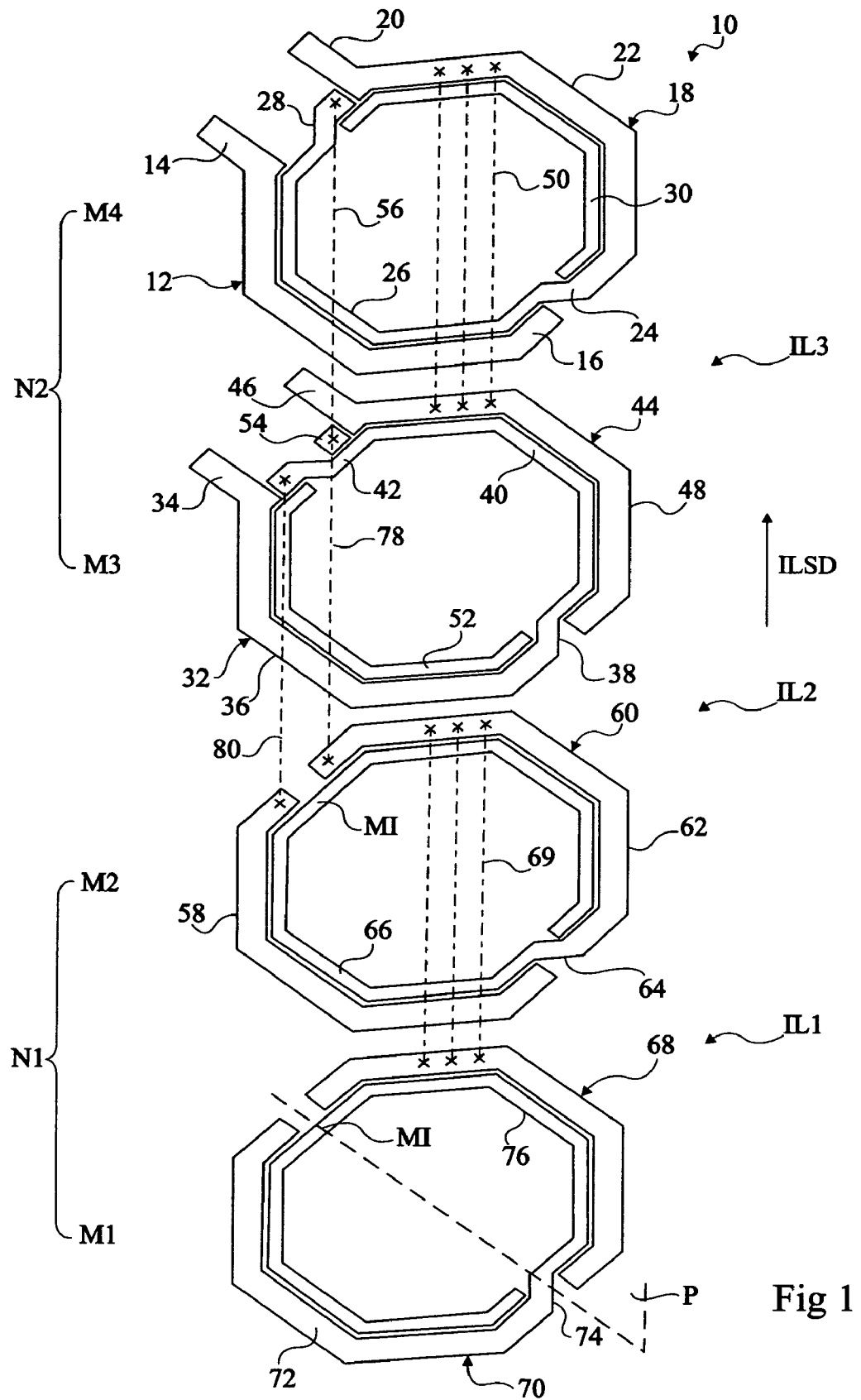
FIG. 1 is a simplified perspective view of the metal tracks of an embodiment of an inductance with two turns formed on two turn levels.

For clarity, the same elements have been designated with the same reference numerals in the different drawings and, further, as usual in the representation of integrated circuits, the various drawings are not drawn to scale.

In the following description, inductances formed in a circuit comprising a stacking of insulating layers covering a substrate are considered. Metal tracks of a given metallization level are associated with each insulating layer. The metallization level used to form the inductance for which the tracks are closest to the substrate is designated the first metallization level. The last metallization level is the metallization level used to form the inductance for which the tracks are most distant from the substrate. An inductance turn corresponds to one or several metal tracks, possibly of different metallization levels, connected to one another to be electrically equivalent to a single turn-shaped track. A half-turn corresponds to one or several metal tracks, possibly of different metallization levels, connected to one another to be electrically equivalent to a single track having the shape of a turn half.

Further, in the following description, a track of a given metallization level is said to be aligned with a track of another metallization level if, as seen from the insulating layer stacking direction, the tracks substantially completely overlap. A track of a given metallization level is said to be partially aligned with a track of another metallization level if, as seen along the insulating layer stacking direction, the tracks substantially completely overlap only along part of their length.

In the following description, a half-turn of an inductance may comprise a metal track of a single metallization level or several metal tracks of successive metallization levels which are aligned and connected to one another along their entire length by conductive vias. In both cases, the half-turn is considered to belong to a single turn level. In the following description, the turn level for which a half-turn only comprises a track of the first metallization level or comprises tracks of first metallization levels which are aligned and connected to one another along their entire length by conductive vias is designate a first turn level. The turn level for which a half-turn only comprises a track of the last metallization level or comprises tracks of the last metallization levels which are aligned and connected to one another along their entire length by conductive vias is designated a last turn level. In the following description, two half-turns are said to be aligned when all the metal tracks which form them are aligned. Further, first and second aligned half-turns are said to be adjacent if there is no third half-turn aligned with the first and second half-turns interposed between the first and second half-turns.

The present invention comprises the forming of an inductance having its half-turns connected to one another so that, for each pair of first and second aligned half-turns belonging to two turn levels which are successive or possibly separated by an intermediary turn level, the number of half-turns conducting the current between the first half-turn and the second half-turn is as small as possible, preferably smaller than or equal to 2 and advantageously equal to one. This enables decreasing the voltage drop between the first and second half-turns and thus decreasing parasitic capacitive couplings between the first and second half-turns.

Several embodiments of inductances comprising turns formed in several turn levels will now be described. For each of these embodiments, the inductances are defined so that, for each pair of first and second aligned adjacent half-turns, the current having crossed the first half-turn crosses a single intermediary half-turn before crossing the second half-turn. Parasitic capacitive couplings between the first and second half-turns, which depend on the potential difference between the first and second half-turns are thus decreased.

1. Inductance Formed on Two Turn Levels Comprising Two Turns Per Turn Level

FIG. 1 is a simplified perspective view of the metal tracks of an embodiment of an inductance 10 comprising two turns per turn level on two turn levels N1 and N2. In the present example, a circuit comprising at least four metallization levels labeled M1 to M4, with M1 corresponding to the first metallization level, is considered. First turn level N1 corresponds to metal tracks of first and second metallization levels M1 and M2 and second turn level N2 corresponds to metal tracks of third and fourth metallization levels M3 and M4. In the drawings, the vias connecting metal tracks of successive metallization levels are represented by x's connected by a dotted line.

Insulating layer IL1 separates the tracks of the first metallization level M1 from the tracks of the second metallization level M2. Insulating layer IL2 separates the tracks of the second metallization level M2 from the tracks of the third metallization level M3. Insulating layer IL3 separates the tracks of the third metallization level M3 from the tracks of the fourth metallization level M4. Insulating layers IL1, IL2, IL3 are stacked according to an insulating layer stacking direction ILSD.

In metallization level M4, inductance 10 comprises a track 12 comprising a rectilinear portion 14 forming a first access terminal of inductance 10, portion 14 extending in a portion 16 substantially having the shape of a half-hexagon and corresponding to a first half-turn. Inductance 10 further comprises a track 18 comprising a rectilinear portion 20 forming a second access terminal of inductance 10, with portion 20 extending in a portion 22 substantially having the shape of a half-hexagon and corresponding to a half-turn, with portion 22 extending, via a connection bridge 24, in a portion 26 substantially having the shape of a half-hexagon and corresponding to a half-turn, with portion 26 extending in a connection portion 28. Portions 16 and 22 are substantially symmetrical with respect to a plane P represented by dotted lines. Portion 26 substantially follows the internal edge of portion 16. Inductance 10 comprises a track 30 substantially having the shape of a half-hexagon and corresponding to a half-turn. Portion 26 and track 30 are substantially symmetrical with respect to plane P.

In metallization level M3, inductance 10 comprises a track 32 comprising a rectilinear portion 34 extending in a portion 36 substantially having the shape of a half-hexagon and corresponding to a half-turn, portion 36 extending, via a connection bridge 38, in a portion 40 substantially having the shape of a half-hexagon and corresponding to a half-turn, portion 40 extending in a connection portion 42. Portions 34 and 36 are substantially aligned with portions 14 and 16 and are connected thereto by conductive vias (not shown) along their entire length. Further, portion 40 is substantially aligned with track 30 and is connected thereto by conductive vias (not shown) along its entire length. Inductance 10 further comprises a track 44 comprising a rectilinear portion 46 extending in a portion 48 substantially having the shape of a half-hexagon and corresponding to a half-turn. Portions 46 and 48 are substantially aligned with portions 20 and 22 and are connected thereto along their entire length by conductive vias (three vias 50 being shown as an example between portions 22 and 48). Inductance 10 further comprises a track 52 substantially having the shape of a half-hexagon and corresponding to a half-turn. Track 52 is substantially aligned with portion 26 and is connected thereto along its entire length. Inductance 10 further comprises a connection pad 54 substantially aligned with the free end of connection portion 28 and connected thereto by a via 56. It should be noted that connection bridge 24 is not connected by vias to connection bridge 38.

In metallization level M2, inductance 10 comprises a track 58 substantially having the shape of a half-hexagon and corresponding to a half-turn. Track 58 is substantially aligned with portion 36. Inductance 10 further comprises a track 60 comprising a portion 62 substantially having the shape of a half-hexagon and corresponding to a half-turn, with portion 62 extending, via a connection bridge 64, in a portion 66 substantially having the shape of a hexagon and corresponding to two half-turns. Portion 62 is substantially aligned with track 48 and portions 40 and 52 are substantially aligned with portion 66.

In metallization level M1, inductance 10 comprises a track 68 substantially having the shape of a half-hexagon and corresponding to a half-turn. Track 68 is substantially aligned with portion 62 and is connected thereto along its entire length by vias (three vias 69 being shown as an example). Inductance 10 further comprises a track 70 comprising a portion 72 substantially having the shape of a half-hexagon and corresponding to a half-turn, portion 72 extending, via a connection bridge 74, in a portion 76 substantially having the shape of a half-hexagon and corresponding to two half-turns. Portion 72 is substantially aligned with track 58 to which it is connected along its entire length by vias (not shown). Portion 76 is substantially aligned with portion 66 to which it is connected along its entire length by vias (not shown). It should be noted that connection bridge 64 is not connected by vias to connection bridge 74.

Pad 54 is connected to the free end of portion 62 by a via 78. Connection portion 42 is connected to an end of track 58 by a via 80.

For certain applications, in addition to the main access terminals, it is desirable to have an additional access terminal at a specific point of the inductance for which the voltage between the additional access terminal and one of the main access terminals is opposite to the voltage between the main access terminal and the other main access terminal. Such a point is called the inductance midpoint and the additional access terminal is called the differential access terminal. The midpoint actually corresponds to the inductance point for which the inductive and resistive components of the inductance between one of the main access terminals and the midpoint are identical respectively to the inductive and resistive components of the inductance between the midpoint and the other main access terminal. Inductance 10 exhibits a midpoint MI at the level of the intersection of points 66 (in level M2) and 76 (of level M1) and also of plane P.

Figures 2, 3:
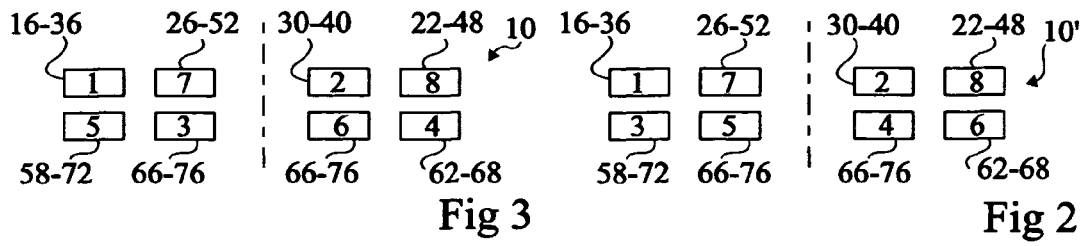
FIG. 2 is a simplified cross-section view of the inductance of FIG. 1 illustrating an example of the order in which the current flows through the inductance turns.
FIG. 3 is a cross-section view similar to FIG. 2 for another example of the order in which the current flows through the inductance turns.

Refer now to FIG. 2, which is a simplified cross-section view of FIG. 1 illustrating an example of the order in which the current flows in the half-turns of inductance 10 of FIG. 1. FIG. 2 shows boxes symbolizing the half-turns of inductance 10 in cross-section view along a plane perpendicular to plane P. Each box is designated with the reference numerals of the metal tracks or portions to which it corresponds. In each box is written a number indicating the order in which the current flows through the corresponding half-turn.

Considering that the current starts its progression through rectilinear portions 14 and 34, the current then flows through portions 16 and 36 (box #1), then continues through portions 30 and 40 (box #2) via connection bridge 38. Then, via connection portion 42 and via 80, the current flows through track 58 and portion 72 (box #3). Then, via connection bridge 74, the current flows through portions 76 and 66 (boxes #4 and #5). Then, via connection bridge 64, the current flows through portion 62 and track 68 (box #6). Then, via 78, connection pad 54, via 56, and connection portion 28, the current flows through portions 26 and 52 (box #7). Then, via connection bridge 24, the current flows through portions 22 and 48 (box #8) to reach rectilinear portions 20 and 46.

FIG. 3 shows another example of the order in which the current flows through an inductance 10' corresponding to a variation of inductance 10 in which portions 62 and track 58 (and track 68 and portion 72) are connected to form a continuous turn, in which portions 66 and 76 are divided into first and second half-turns at the intersection with plane P and in which portion 26 is connected to the first half-turn and portion 30 is connected to the second half-turn. As compared with inductance 10, inductance 10' advantageously comprises a midpoint at the junction between track 58 and portion 60 (and between track 68 and portion 72) which is easily accessible. However, in average, for each pair of first and second adjacent and aligned half-turns, the current having flowed through the first half-turn flows through four intermediary half-turns before crossing the second half-turn. The parasitic capacitive couplings for inductance 10' are thus greater than for inductance 10. Thus, it has been shown that the cut-off frequency of inductance 10 is increased by a factor of approximately 2 with respect to inductance 10' while the inductance values are substantially identical. Further, the quality factor of inductance 10 is improved at high frequencies.

2. Inductance Formed on Four Turn Levels and Comprising One Turn Per Level.

Figure 4:
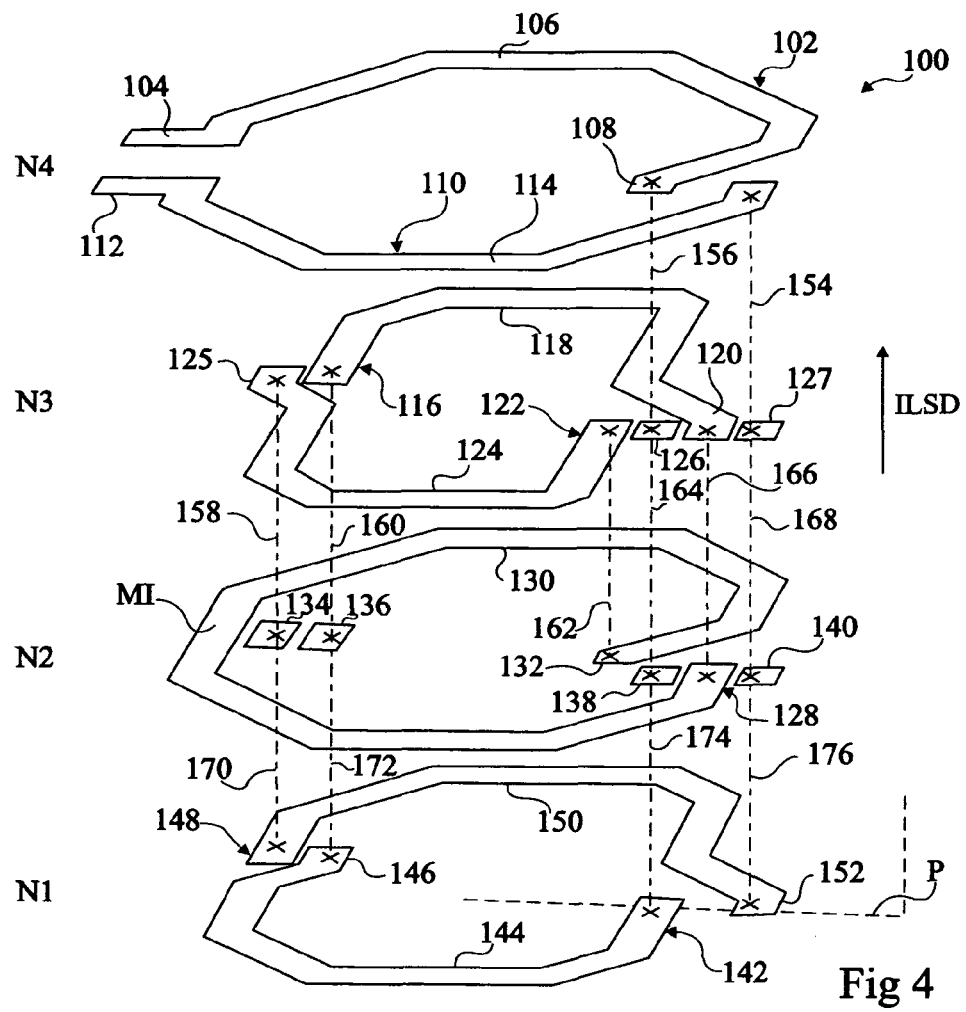

FIG. 4 is a simplified perspective view of the metal tracks of an embodiment of an inductance 100 comprising one turn per turn level over four turn levels N1 to N4. As an example, in the present embodiment and in the other embodiments which will be described hereafter, the half-turns of turn level N1 comprise pairs of metal tracks of two metallization levels M2 and M3 which are aligned and connected to each other along their entire length. Similarly, the half-turns of turn level N2 comprise pairs of metal tracks of two metallization levels M4 and M5 which are aligned and connected together along their entire length. The half-turns of turn level N3 comprise metal tracks of a single metallization level M6 and the half-turns of turn level N4 comprise metal tracks of the last metallization level. For turn levels N1 and N2, a track or a portion thus corresponds to stacked metal tracks of two metallization levels.

In turn level N4, inductance 100 comprises a track 102 comprising a rectilinear portion 104 forming a first access terminal, portion 104 extending in a portion 106 substantially having the shape of a half-hexagon and corresponding to a half-turn, portion 106 extending in a connection portion 108. Inductance 100 further comprises a track 110 comprising a rectilinear portion 112 forming a second access terminal, portion 112 extending in a portion 114 substantially having the shape of a half-hexagon and corresponding to a half-turn. Portions 106 and 114 are substantially symmetrical with respect to plane P.

In turn level N3, inductance 100 comprises a track 116 comprising a U-shaped portion 118 and corresponding to a half-turn, portion 118 extending in a connection portion 120. Inductance 100 further comprises a track 122 comprising a U-shaped portion 124 and corresponding to a half-turn, portion 124 extending in a connection portion 125. Inductance 100 further comprises two connection pads 126, 127. Portions 118, 124 are substantially symmetrical with respect to plane P.

In turn level N2, inductance 100 comprises a track 128 comprising a portion 130 substantially having the shape of a hexagon and corresponding to two half-turns, portion 130 extending in a connection portion 132. Further, inductance 100 comprises connection pads 134, 136, 138, 140. Portions 106 and 114 are substantially aligned with portion 130. Connection portion 132 is substantially aligned with connection portion 108. Pads 138, 140 are respectively aligned with pads 126 and 127.

In turn level N1, inductance 100 comprises a track 142 comprising a portion 144 substantially having the shape of a half-hexagon and corresponding to a half-turn, portion 144 extending in a connection portion 146. Inductance 100 further comprises a track 148 comprising a portion 150 substantially having the shape of a half-hexagon and corresponding to a half-turn, portion 150 extending in a connection portion 152. Portion 124 is partially aligned with portion 144 and portion 118 is partially aligned with portion 150.

The connections between the different turn levels are the following. The free end of portion 114 is connected to pad 127 by a via 154. Connection portion 108 is connected to pad 126 by a via 156. Connection portion 125 is connected to pad 134 by a via 158. The free end of portion 118 is connected to pad 136 by a via 160. The free end of portion 124 is connected to connection portion 132 by a via 162. Pad 126 is connected to pad 138 by a via 164. Connection portion 120 is connected to the free end of portion 130 by a via 166. Pad 127 is connected to pad 140 by a via 168. Pad 134 is connected to the free end of portion 150 by a via 170. Pad 136 is connected to connection portion 146 by a via 172. Pad 138 is connected to the free end of portion 144 by a via 174. Pad 140 is connected to connection portion 152 by a via 176.

In this embodiment, a first group G1_1 of first half-turns corresponds to portions 114, 124, 144 and half of portion 130. A pair P1_1 of first half-turns corresponds to portions 114 and 124. Another pair P1_2 of first half-turns corresponds to portions 124 and half of portion 130. Another pair P1_3 of first half-turns corresponds to half of portion 130 and portion 144. A second group of G2_1 of second half-turns corresponds to portions 106, 118, 150 and half of portion 130. A pair P2_1 of second half-turns corresponds to portions 106 and 118. Another pair P2_2 of second half-turns corresponds to portion 118 and half of portion 130. Another pair P2_3 of second half-turns corresponds to half of portion 130 and portion 150. Therefore, for each pair of first and second adjacent and aligned half turns, the current having flowed through the first half-turn flows through an intermediary half-turn before crossing the second half-turn. For example, for pair P1_1, the current having flowed through portion 114 flows through intermediary half-turn corresponding to portion 150 before crossing portion 124.

Figure 5:
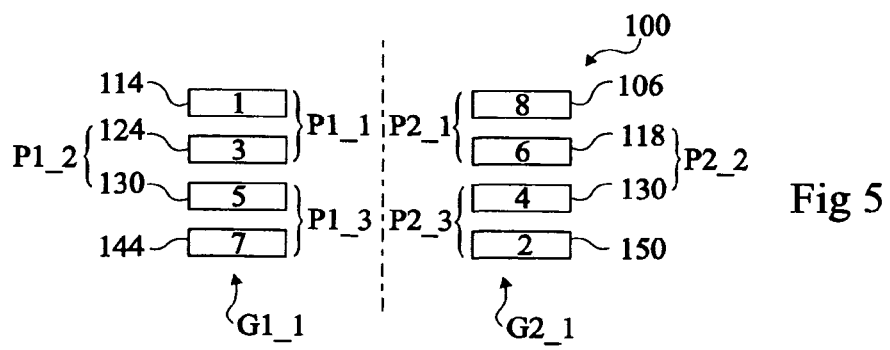

FIG. 5 is a view similar to FIG. 2 and illustrates and example of the order in which the current flows through the half-turns of inductance 100 of FIG. 4. Considering that the current starts from portion 112, it flows on through track 114 (box #1). Then, via via 154, pad 127, via 168, pad 140, via 176, and connection portion 152, the current flows through portion 150 (box #2). Then, via via 170, pad 134, via 158, and connection portion 125, the current flows through portion 124 (box #3). Then, via via 162 and connection portion 132, the current flows through portion 130 (boxes #4 and 5). Then, via via 166 and connection portion 120, the current flows through portion 118 (box #6). Then, via via 160, pad 136, via 172, and connection portion 146, the current flows through portion 144 (box #7). Finally, via via 174, pad 138, via 164, pad 126, via 156, and connection portion 108, the current flows through portion 106 (box #8) and escapes through portion 104.

Inductance 100 comprises a midpoint MI, easily accessible, at the intersection between portion 130 and plane P.

3. Inductance Formed on Four Turn Levels and Comprising Two Turns Per Turn Level.

FIG. 6 is a simplified perspective view of the metal tracks of an embodiment of an inductance 200 comprising two turns per turn level on four turn levels N1 to N4.

In turn level N4, inductance 200 comprises a track 202 comprising a rectilinear portion 204, forming an access terminal, extending in a portion 206 substantially having the shape of a half-hexagon and corresponding to a half-turn. Inductance 200 further comprises a track 208 comprising a rectilinear portion 210, forming an access terminal, extending in a portion 212 substantially having the shape of a half-hexagon and corresponding to a half-turn, portion 212 extending in a portion 214 substantially having the shape of a half-hexagon and corresponding to a half-turn, portion 214 extending in a connection portion 216. Inductance 200 further comprises a track 218 substantially having the shape of a half-hexagon and corresponding to a half-turn. Further, inductance 200 comprises two tracks 222 and 224 forming connection portions. Portions 206 and 212 are substantially symmetrical with respect to plane P. Further, portion 214 and track 218 are substantially symmetrical with respect to plane P. Portion 214 is formed inside of portion 206 and track 218 is formed inside of portion 212.

In turn level N3, inductance 200 comprises a track 226 substantially having the shape of a half-hexagon and corresponding to a half-turn. Track 226 is located, in top view, substantially between portion 212 and track 218. Inductance 200 further comprises a track 228 comprising a connection portion 230 extending in a portion 232 substantially having the shape of a half-hexagon and corresponding to a half-turn, portion 232 extending in a portion 234 substantially having the shape of a half-hexagon and corresponding to two half-turns. Portion 234 is located, in top view, substantially inside of track 218 and of portion 214. Portions 226 and 232 are substantially symmetrical with respect to plane P and plane P substantially corresponds to a plane of symmetry of portion 234. Inductance 200 comprises two tracks 236 and 238 forming connection bridges. Further, inductance 200 comprises two connection pads 240, 242.

In turn level N2, inductance 200 comprises a track 244 substantially having the shape of a half-hexagon and corresponding to a half-turn. Inductance 200 further comprises a track 246 comprising a portion 248 substantially having the shape of a half-hexagon and corresponding to a half-turn, portion 248 extending in a portion 250 substantially having the shape of a half-hexagon and corresponding to a half-turn. Inductance 200 further comprises a track 252 comprising a portion 254 substantially having the shape of a half-hexagon and corresponding to a half-turn, portion 254 substantially having the shape of a half-hexagon and corresponding to a half-turn, portion 254 extending in a connection portion 256. Inductance 200 further comprises a track 258 forming a connection bridge and comprises connection pads 260, 262. Portion 244 is substantially aligned with portion 206. Portion 248 is substantially aligned with portion 212 and portion 250 is substantially aligned with portion 214. Connection bridge 258 is substantially aligned with connection bridge 222. Pad 260 is aligned with pad 242.

In turn level N1, inductance 200 comprises a track 263 comprising a portion 264 substantially having the shape of a half-hexagon and corresponding to a half-turn, portion 264 extending in a connection portion 265. Inductance 200 further comprises a track 266 comprising a portion 268 substantially having the shape of a half-hexagon and corresponding to a half-turn, portion 268 extending in a portion 270 substantially having the shape of a half-hexagon and corresponding to a half-turn. Inductance 200 further comprises a track 272 substantially having the shape of a half-hexagon and corresponding to a half-turn. Inductance 200 further comprises a connection bridge 274. Portion 268 is aligned with portion 232. Portions 270 and 272 are partially aligned with portion 234. Portion 264 is aligned with track 226. Connection bridge 274 is aligned with connection bridge 236.

The connections between turn levels N4 and N3 are the following. Connection bridge 236 connects the free end of portion 206 to a first end of track 218 by vias 276 and 278. Connection bridge 222 connects the free end of portion 234 to a first end of track 226 by vias 280 and 282. The second end of track 218 is connected to connection bridge 238 by a via 284. Connection bridge 224 connects the second end of track 226 to pad 242 by vias 286, 288. Connection portion 216 is connected to pad 240 by a via 290.

The connections between turn levels N3 and N2 are the following. Connection bridge 238 is connected to a first end of track 244 by a via 292. Pad 240 is connected to the free end of portion 248 by a via 294. Pad 242 is connected to pad 260 by a via 296 and connection portion 230 is connected to pad 262 by a via 298.

The connections between levels N2 and N1 are the following. Connection bridge 274 connects the second end of track 244 to the free end of portion 254 by vias 300 and 302. Connection bridge 258 connects a first end of track 272 to the free end of portion 264 by vias 304, 306. Connection portion 256 is connected to the free end of portion 268 by a via 308. The free end of portion 250 is connected to connection portion 265 by a via 310. Pad 260 is connected to the second end of track 272 by a via 312 and pad 262 is connected to the free end of portion 270 by a via 314.

In this embodiment, a first group G1_1 of first half-turns corresponds to portion 206 and track 244. Another first group G1_2 of first half-turns corresponds to portions 232 and 268. Another first group G1_3 of first half-turns corresponds to portions 214 and 250. Another first group G1_4 of first half-turns corresponds to half of portion 234 and track 272. A second group G2_1 of second half turns corresponds to portions 212 and 248. Another second group G2_2 of second half-turns corresponds to track 226 and portion 264. Another second group G2_3 of second half-turns corresponds to track 218 and portion 254. Another second group G2_4 of second half-turns corresponds to half or portion 234 and portion 270. In this embodiment, portion 214 of turn level N4 is aligned with portion 250 of turn level N2, turn level N3 being an intermediary turn level between turn levels N4 and N2. Moreover, since turn level N4 comprises tracks of the last metallization level and turn level N3 comprises tracks of a metallization level M6, portion 214 is separated from portion 250 by intermediary metallization level M6.

FIG. 7 is a view similar to FIG. 2 and illustrates an example of the order in which the current flows through the half-turns of inductance 200 of FIG. 6. Considering that the current starts from access terminal 204, it flows through portion 206 (box #1). Then via via 276, connection bridge 236 and via 278, the current runs through track 218 (box #2). Then via via 284, connection bridge 238 and via 292, the current runs through track 244 (box #3). Then via via 300, connection bridge 274, and via 302, the current runs through portion 254 (box #4). Then via connection portion 256 and via 308, the current runs through portion 268 (box #5) and portion 270 (box #6). Then, via via 314, pad 262, via 298, and connection portion 230, the current runs through portion 232 (box #7) and portion 234 (boxes #8 and 9). Then via via 280, connection bridge 222, and via 282, the current runs through track 226 (box #10). Then via via 286, connection bridge 224, via 288, pad 242, via 296, pad 260, and via 312, the current runs through track 272 (box #11). Then via via 304, connection bridge 258, and via 306, the current runs through portion 264 (box #12). Then, via connection portion 265 and via 310, the current runs through portion 250 (box #13), then portion 248 (box #14). Then via via 294, pad 240, via 290, and connection portion 216, the current runs through portion 214 (box #15), then portion 212 (box #16) to come out through access terminal 210.

Inductance 200 comprises a midpoint MI at the intersection between portion 234 and plane P.

4. Inductance Formed on Four Turn Levels and Comprising Two Turns Per Turn Level.

Figures 8, 9:
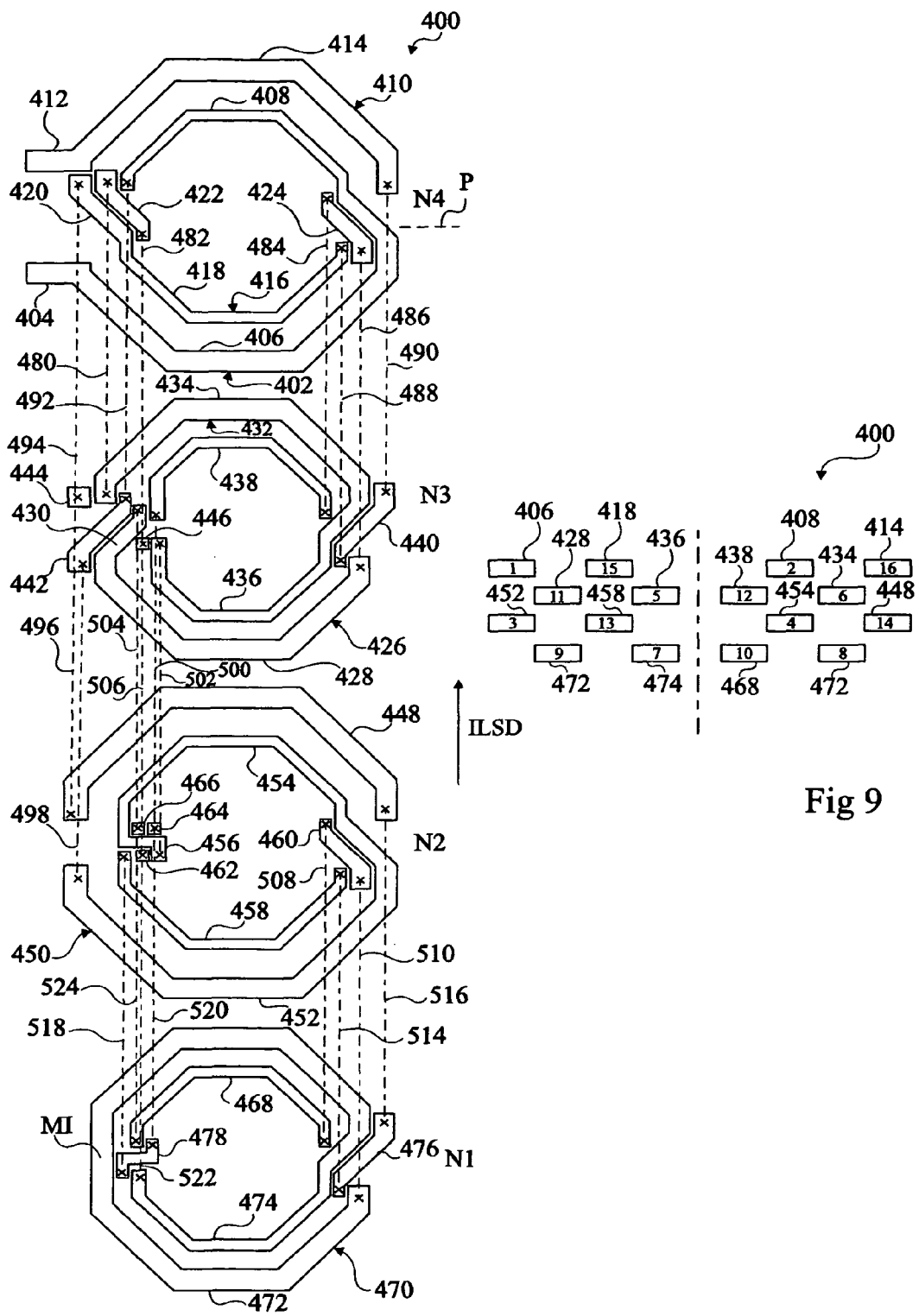

FIG. 8 is a simplified top view of the turn levels, shown under one another, of another embodiment of an inductance 400 comprising two turns per turn level on four turn levels N1 to N4.

In turn level N4, inductance 400 comprises a track 402 comprising a rectilinear portion 404 forming an access terminal which extends in a portion 406 substantially having the shape of a half-hexagon and corresponding to a half-turn, portion 406 extending in a portion 408 substantially having the shape of a half-hexagon and corresponding to a half-turn. Inductance 400 further comprises a track 410 comprising a rectilinear portion 412 forming an access terminal which extends in a portion 414 substantially having the shape of a half-hexagon and corresponding to a half-turn. Inductance 400 further comprises a track 416 comprising a portion 418 substantially having the shape of a half-hexagon and corresponding to a half-turn, portion 418 extending in a connection portion 420. Inductance 400 further comprises tracks 422 and 424 forming connection bridges. Portions 406 and 414 are substantially symmetrical with respect to plane P. Portions 408 and 418 are substantially symmetrical with respect to plane P. Portion 408 extends inside of portion 414 and portion 418 extends inside of portion 406.

In turn level N3, inductance 400 comprises a track 426 comprising a portion 428 substantially having the shape of a half-hexagon and corresponding to a half-turn, portion 428 extending in a connection portion 430. Inductance 400 further comprises a track 432 comprising a portion 434 substantially having the shape of a half-hexagon and corresponding to a half-turn, portion 434 extending in a portion 436 substantially having the shape of a half-hexagon and corresponding to a half-turn. Inductance 400 further comprises a track 438 substantially having the shape of a half-hexagon and corresponding to a half-turn. Inductance 400 further comprises two tracks 440, 442 forming connection bridges and pads 444 and 446. Portions 428 and 434 are substantially symmetrical with respect to plane P. Portion 436 and track 438 are substantially symmetrical with respect to plane P. Portion 428 is located, in top view, substantially between portion 406 and portion 418. Portion 434 is located, in top view, substantially between portion 414 and portion 408. Portion 436 is located, in top view, substantially inside of portion 418 and track 438 is located, in top view, substantially inside of portion 408.

In turn level N2, inductance 400 comprises a track 448 substantially having the shape of a half-hexagon and corresponding to a half-turn. Inductance 400 further comprises a track 450 comprising a portion 452 substantially having the shape of a half-hexagon and corresponding to a half-turn, portion 452 extending in a portion 454, substantially having the shape of a half-hexagon and corresponding to a half-turn, portion 454 extending in a connection portion 456. Inductance 400 further comprises a track 458 substantially having the shape of a half-hexagon and corresponding to a half-turn. Inductance 400 further comprises a track 460 forming a connection bridge and three connection pads 462, 464, and 466. Portion 452 is substantially aligned with portion 406. Connection bridge 460 is substantially aligned with connection bridge 424. Portion 454 is substantially aligned with portion 408. Track 448 is substantially aligned with portion 414. Track 458 is substantially aligned with portion 418.

In turn level N1, inductance 400 comprises a track 468 substantially having the shape of a half-hexagon and corresponding to a half-turn. Inductance 400 further comprises a track 470 comprising a portion 472 substantially having the shape of a hexagon and corresponding to two half-turns, portion 472 extending in a portion 474 substantially having the shape of a half-hexagon and corresponding to a half-turn. The inductance further comprises two tracks 476 and 478 forming connection bridges. Portions 434 and 428 are substantially aligned with portion 472. Portion 474 is partially aligned with portion 436 and track 468 is partially aligned with track 438. Connection bridge 476 is substantially aligned with connection bridge 440.

The connections between turn levels N4 and N3 are the following. Connection bridge 422 connects the free end of portion 434 to pad 446 by vias 480 and 482. Connection bridge 424 connects a first end of track 438 to the free end of portion 428 by vias 484 and 486. Connection bridge 440 connects the free end of portion 418 to the free end of portion 414 by vias 488 and 490. The free end of portion 408 is connected to connection bridge 442 by a via 492. Connection portion 420 is connected to pad 444 by a via 494.

The connections between turn levels N3 and N2 are the following. Pad 444 is connected to a first end of track 448 by a via 496. Connection bridge 442 is connected to the free end of portion 452 by a via 498. The second end of track 438 is connected to pad 464 by a via 500 and the free end of portion 436 is connected to connection portion 456 by a via 502. Connection portion 430 is connected to pad 466 by a via 504 and pad 446 is connected to pad 462 by a via 506.

The connections between turn levels N2 and N1 are the following. Connection bridge 460 connects a first end of track 468 to the free end of portion 472 by vias 508 and 510. Connection bridge 476 connects a first end of track 458 to the second end of track 448 by vias 514 and 516. Connection bridge 478 connects the second end of track 458 to pad 464 by vias 518 and 520. The free end of portion 474 is connected to pad 462 by a via 522 and the second end of track 468 is connected to pad 466 by a via 524.

FIG. 9 is a view similar to FIG. 2 and illustrates an example of the order in which the current flows in the half-turns of inductance 400 of FIG. 8. Considering that the current starts from access terminal 404, the current runs through portion 406 (box #1), then through portion 408 (box #2). Then, via via 492, connection bridge 442, and via 498, the current runs through portion 452 (box #3), then through portion 454 (box #4). Then, via connection portion 456 and via 502, the current runs through portion 436 (box #5), then through portion 434 (box #6). Then, via via 480, connection bridge 422, via 482, pad 446, via 506, pad 462, and via 522, the current runs through portion 474 (box #7), then through portion 472 (boxes #8 and 9). Then, via via 510, connection bridge 460 and via 508, the current runs through portion 468 (box #10). Then, via via 524, pad 466, via 504, and connection portion 430, the current runs through portion 428 (box #11). Then, via via 486, connection bridge 424, and via 484, the current runs through track 438 (box #12). Then, via via 500, pad 464, via 520, connection bridge 478, and via 518, the current runs through portion 458 (box #13). Then, via via 514, connection bridge 476, and via 516, the current runs through track 448 (box #14). Then, via via 496, pad 444, via 494, and connection portion 420, the current runs through portion 418 (box #15). Then, via via 488, connection bridge 440, and via 490, the current runs through portion 414 (box #16) to reach access terminal 412.

Inductance 400 comprises a midpoint MI at the intersection between portion 472 of turn level N1 and plane P. As compared with inductance 200, an advantage of inductance 400 is that the associated midpoint MI is easily accessible from the outside of inductance 400.

5. Inductance Formed on Four Turn Levels and Comprising Three Turns Per Turn Level.

FIG. 10 is a simplified top view of the turn levels, shown under one another, of another embodiment of an inductance 600 comprising three turns per turn level on four turn levels N1 to N4.

In turn level N4, inductance 600 comprises a track 602 comprising a rectilinear portion 604 forming an access terminal which extends in a portion 606 substantially having the shape of a half-hexagon and corresponding to a half-turn. Inductance 600 further comprises a track 608 comprising a rectilinear portion 610 forming an access terminal which extends in a portion 612 substantially having the shape of a half-hexagon and corresponding to a half-turn, portion 612 extending in a connection portion 614. Inductance 600 further comprises a track 614 comprising a portion 616 substantially having the shape of a half-hexagon and corresponding to a half-turn, portion 616 extending in a connection portion 618. Inductance 600 further comprises a track 620 comprising a portion 622 substantially having the shape of a half-hexagon and corresponding to a half-turn, portion 622 extending in a portion 624 substantially having the shape of a half-hexagon and corresponding to a half-turn. Inductance 600 further comprises a track 626 comprising a portion 628 substantially having the shape of a half-hexagon and corresponding to a half-turn, portion 628 extending in a connection portion 630. Inductance 600 further comprises tracks 632 and 634 forming connection bridges. Portions 606 and 612 are substantially symmetrical with respect to plane P. Portions 622 and 616 are substantially symmetrical with respect to plane P. Portions 624 and 628 are substantially symmetrical with respect to plane P. Portion 628 extends inside of portion 622 which, itself, extends inside of portion 606. Portion 624 extends inside of portion 616 which, itself, extends inside of portion 612.

In turn level N3, inductance 600 comprises a track 636 comprising a portion 638 substantially having the shape of a half-hexagon and corresponding to a half-turn, portion 638 extending in a connection portion 640. The inductance further comprises a track 642 comprising a portion 644 substantially having the shape of a half-hexagon and corresponding to a half-turn, portion 644 extending in a connection portion 646. Inductance 600 further comprises a track 648 comprising a portion 650 substantially having the shape of a half-hexagon and corresponding to a half-turn, portion 650 extending in a connection portion 652. Inductance 600 further comprises a track 654 comprising a portion 656 substantially having the shape of a half-hexagon and corresponding to a half-turn, portion 656 extending in a connection portion 658. Inductance 600 further comprises a track 660 substantially having the shape of a half-hexagon and corresponding to a half-turn. Inductance 600 further comprises a track 662 comprising a portion 664 substantially having the shape of a half-hexagon and corresponding to a half-turn, portion 664 extending in a connection portion 666. Inductance 600 further comprises a track 668 forming a connection bridge and two connection pads 669 and 670. Portions 638 and 644 are substantially symmetrical with respect to plane P. Portions 650 and 656 are substantially symmetrical with respect to plane P. Portion 664 and track 660 are substantially symmetrical with respect to plane P. Portion 638 is located, in top view, substantially between portion 606 and portion 622. Portion 650 is located, in top view, substantially between portion 622 and portion 628. Track 660 is located, in top view, substantially inside of portion 628. Portion 644 is located, in top view, substantially between portion 612 and portion 616. Portion 656 is located, in top view, substantially between portion 616 and portion 624. Portion 664 is located, in top view, substantially inside of portion 624.

In turn level N2, inductance 600 comprises a track 671 comprising a portion 672 substantially having the shape of a half-hexagon and corresponding to a half-turn, portion 672 extending in a connection portion 674. Inductance 600 further comprises a track 676 substantially having the shape of a half-hexagon and corresponding to a half-turn. Inductance 600 further comprises a track 678 comprising a connection portion 680 extending in a portion 682 substantially having the shape of a half-hexagon and corresponding to a half-turn, portion 682 extending in a connection portion 684. The inductance further comprises a track 686 substantially having the shape of a half-hexagon and corresponding to a half-turn. Inductance 600 further comprises a track 688 substantially having the shape of a half-hexagon and corresponding to a half-turn. Inductance 600 further comprises a track 690 having a portion 692 substantially having the shape of a half-hexagon and corresponding to a half-turn, with portion 692 extending in a connection portion 694. Inductance 600 further comprises a track 696 forming a connection bridge and a connection pad 698. Portion 672 is substantially aligned with portion 606. Track 676 is substantially aligned with portion 612. Portion 682 is substantially aligned with portion 622. Track 686 is substantially aligned with portion 616. Track 688 is substantially aligned with portion 628. Portion 692 is substantially aligned with portion 624.

In turn level N1, inductance 600 comprises a track 700 comprising a portion 702 substantially having the shape of a hexagon and corresponding to two half-turns, with portion 702 extending in a connection portion 704. Inductance 600 further comprises a track 706 comprising a portion 708 substantially having the shape of a half-hexagon and corresponding to a half-turn, portion 708 extending in a connection portion 710. Inductance 600 further comprises a track 712 comprising a portion 714 substantially having the shape of a half-hexagon and corresponding to a half-turn, portion 714 extending in a portion 716 partially having the shape of a half-hexagon and corresponding to a half-turn, with portion 716 extending in a connection portion 718. Inductance 600 further comprises a track 720 partially having the shape of a half-hexagon and corresponding to a half-turn. Inductance 600 further comprises a track 722 forming a connection bridge. Portions 638 and 644 are substantially aligned with portion 702. Portion 708 is substantially aligned with portion 650. Track 720 is partially aligned with portion 664. Portion 714 is substantially aligned with portion 656. Portion 716 is substantially aligned with track 660.

The connections between turn levels N4 and N3 are the following. Connection bridge 632 connects pad 669 to the free end of portion 656 by vias 724 and 726. Connection bridge 634 connects the free ends of portion 638 to pad 670 by vias 728 and 730. Connection bridge 668 connects the free end of portion 616 to the free end of portion 628 by vias 732 and 734. The free end of portion 606 is connected to connection portion 658 by a via 736. Connection portion 630 is connected to the free end of portion 644 by a via 738. The free end of portion 622 is connected to connection portion 666 by a via 740. Connection portion 614 is connected to the free end of portion 650 by a via 742. The free end of portion 624 is connected to connection portion 640 by a via 744. Connection portion 618 is connected to the free end of track 660 by a via 746.

The connections between turn levels N3 and N2 are the following. Connection portion 652 is connected to a first end of track 676 by a via 748. Pad 669 is connected to the free end of portion 672 by a via 750. Connection portion 646 is connected to a first end of track 688 by a via 752. Pad 670 is connected to the free end of portion 692 by a via 754. The free end of portion 664 is connected to connection portion 680 by a via 756. The second end of track 660 is connected to pad 698 by a via 758.

The connections between turn levels N2 and N1 are the following. Connection bridge 722 connects a first end of track 686 to pads 698 by vias 760 and 762. Connection bridge 696 connects the free end of portion 708 to a first end of track 720 by vias 764 and 766. The second end of track 676 is connected to connection portion 710 by a via 768. Connection portion 694 is connected to the free end of portion 702 by a via 770. The second end of track 686 is connected to connection portion 718 by a via 772. Connection portion 674 is connected to the free end of portion 714 by a via 774. The second end of track 688 is connected to connection portion 704 by a via 776. Connection portion 684 is connected to the second end of track 720 by a via 778.

FIG. 11 is a view similar to FIG. 2 and illustrates an example of the order in which the current flows in the half-turns of inductance 600 of FIG. 10. Considering that the current starts from access terminal 604, the current runs through portion 606 (box #1). Then, via via 736 and connection portion 658, the current runs through portion 656 (box #2). Then, via via 726, connection bridge 632, via 724, pad 669, and via 750, the current runs through portion 672 (box #3). Then, via connection portion 674 and via 774, the current runs through portion 714 (box #4), then through portion 716 (box #5). Then, via connection portion 718 and via 772, the current runs through track 686 (box #6). Then, via via 760, connection bridge 722, via 762, pad 698, and via 758, the current runs through track 660 (box #7). Then, via via 746 and connection portion 618, the current runs through portion 616 (box #8). Then, via via 732, connection bridge 668, and via 734, the current runs through portion 628 (box #9). Then, via connection portion 630 and via 738, the current runs through portion 644 (box #10). Then, via connection portion 646 and via 752, the current runs through track 688 (box #11). Then, via via 776 and connection portion 704, the current runs through portion 702 (boxes #12 and 13). Then, via via 770 and connection portion 694, the current runs through portion 692 (box #14). Then, via via 754, pad 670, via 730, connection bridge 634, and via 728, the current runs through portion 638 (box #15). Then, via connection portion 640 and via 744, the current runs through portion 624 (box #16), then through portion 622 (box #17). Then, via via 740 and connection portion 666, the current runs through portion 664 (box #18). Then, via via 756 and connection portion 680, the current runs through portion 682 (box #19). Then, via connection portion 684 and via 778, the current runs through track 720 (box #20). Then, via via 766, connection bridge 696, and via 764, the current runs through portion 708 (box #21). Then, via connection portion 710 and via 768, the current runs through track 676 (box #22). Then, via via 748 and connection portion 652, the current runs through portion 650 (box #23). Then, via via 742 and connection portion 614, the current runs through portion 612 (box #24) to reach access terminal 610.

Inductance 600 comprises a midpoint MI, easily accessible, at the intersection between portion 702 of turn level N1 and plane P.

Specific embodiments of the present invention have been described. Various alterations and modifications will occur to those skilled in the art. In particular, although the shown turns are hexagon-shaped, they may have different shapes, for example, circular or rectangular.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An inductance formed in a stack of insulating layers, and having first and second half-turns, each first half-turn being at least partly symmetrical to one of the second half-turns, the first half-turns being distributed in first groups of first half-turns at least partly aligned along the insulating layer stacking direction and the second half-turns being distributed in second groups of second half-turns at least partly aligned along the insulating layer stacking direction, wherein for any pair of first adjacent half-turns of a same group, one of the first half-turns in the pair is electrically series-connected to the other one of the first half-turns in the pair by a single second half turn and wherein for each pair of second adjacent half-turns of a same group, one of the second half-turns in the pair is electrically series-connected to the other one of the second half-turns in the pair by a single first half-turn, and adapted to have decreased capacitive coupling between the first and second half-turns, the inductance comprising:

metal tracks of at least first, second, third, and fourth metallization levels, in the first metallization level:

a first track forming a first half-turn and connected to a first access terminal;

a second track at least partly symmetrical to the first track with respect to a plane and forming a second half-turn, the second track being connected to a second access terminal, the second track extending in a third track extending at least partly inside of the first track and forming a third half-turn; and a fourth track at least partly symmetrical to the third track with respect to said plane and forming a fourth half-turn;

in the second metallization level:

a fifth track aligned with the first track and connected to the first track along its entire length, the fifth track extending in a sixth track aligned with the fourth track and connected to the fourth track along its entire length;

a seventh track aligned with the second track and connected to the second track along its entire length; and an eighth track aligned with the third track and connected to the third track along its entire length;

in the third metallization level:

a ninth track at least partially aligned with the first track and forming a fifth half-turn, the ninth track being series-connected to the sixth track;

a tenth track at least partially aligned with the second track and forming a sixth half-turn, the tenth track being series-connected to the third track, the tenth track extending in an eleventh track at least partially aligned with the third track and in symmetry with the fourth track and forming seventh and eighth half-turns; and in the fourth metallization level:

a twelfth track aligned with the ninth track and connected to the ninth track along its entire length, the twelfth track extending in a thirteenth track aligned with the eleventh track and connected to the eleventh track along its entire length; and a fourteenth track aligned with the tenth track and connected to the tenth track along its entire length.

* * * * *